United States Patent [19]
Chien et al.

[11] Patent Number: 5,643,824
[45] Date of Patent: Jul. 1, 1997

[54] METHOD OF FORMING NITRIDE SIDEWALLS HAVING SPACER FEET IN A LOCOS PROCESS

[75] Inventors: Rong-Wu Chien, Chyai; Ming-Hong Kuo, Ping-Ting; Hsu-Li Cheng, Tainan, all of Taiwan

[73] Assignee: Vanguard International Semiconductor Corporation, Hsin-Chu, Taiwan

[21] Appl. No.: 688,068

[22] Filed: Jul. 29, 1996

[51] Int. Cl.$^6$ .................................................. H01L 21/76
[52] U.S. Cl. ............................. 437/69; 437/72; 437/73
[58] Field of Search .................................. 437/69, 70, 72, 437/73

[56] References Cited

U.S. PATENT DOCUMENTS

| | | | |
|---|---|---|---|
| 4,981,813 | 1/1991 | Bryant et al. | 437/69 |
| 4,986,879 | 1/1991 | Lee | 156/649 |
| 5,173,444 | 12/1992 | Kawamura | 437/69 |
| 5,248,350 | 9/1993 | Lee | 148/33.2 |
| 5,294,563 | 3/1994 | Rao et al. | 437/69 |
| 5,318,922 | 6/1994 | Lim et al. | 437/69 |
| 5,369,051 | 11/1994 | Rao et al. | 437/70 |
| 5,399,520 | 3/1995 | Jang | 437/67 |
| 5,472,906 | 12/1995 | Shimizu et al. | 437/72 |

*Primary Examiner*—Trung Dang
*Attorney, Agent, or Firm*—George O. Saile; William J. Stoffel

[57] ABSTRACT

The invention provides a method of forming field oxide regions between active regions in a semiconductor substrate. The invention forms nitride feet on the sidewalls of a nitride oxidation mask to prevent formation of the bird's beak on the field oxide and reduce stress in the active areas. The invention begins by forming a first oxide layer and a masking block, over the active regions. A second nitride layer is deposited over the masking block and the substrate surface. The second nitride layer is anisotropically etched with a customized etch forming nitride spacers on the sidewalls of the masking block, and nitride spacer feet on the surface of the first oxide layer. The customized etch of the invention optimizes the microloading effects to properly form the nitride feet. The substrate is oxidized, using the masking block nitride spacers and the nitride spacer feet as an oxidation mask to form field oxide regions. The nitride feet eliminate bird's beak problem. In another embodiment, a trench is formed in the substrate and the trench is oxidized to form a field oxide region which is level with the substrate surface. Lastly, the masking block, the nitride spacer, and nitride spacer feet are removed.

34 Claims, 4 Drawing Sheets

METHOD OF FORMING NITRIDE SIDEWALLS HAVING SPACER FEET IN A LOCOS PROCESS

BACKGROUND OF THE INVENTION (1) Field of the Invention

The present invention relates in general to methods for the formation of a device separation film among manufacturing processes for a semiconductor device and more particularly to methods for forming a field oxide film in the semiconductor device.

(2) Description of the Prior Art

The fabrication of an integrated circuit normally begins by processing the semiconductor substrate or wafer to divide the surface area into regions where active devices and substrate embedded interconnects are to be formed, and other regions of dielectric which electrically separate the active device regions. The field oxide dielectric material is routinely silicon dioxide. Though various field oxide formation techniques have been developed and described, the technique commonly known as the localized oxidation of silicon (LOCOS) remains common in the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process and its progeny, such as the FUROX and SWAMI techniques, exhibit deficiencies which reduce yield or performance in the final semiconductor chip product.

The most frequently encountered deficiency in the prior art techniques is commonly known as the bird's beak problem, wherein the field oxide extends under the masking nitride layer to consume some of the usable active area. Additional problems routinely encountered with known field oxide formation processes include stress induced dislocations at the edges of the active regions, and the presence of a relatively non-planar surface in or adjacent the fully formed field oxide. The non-planar recesses or notches at the edges of the active regions often degrade subsequently formed gate oxide. These recesses can trap conductive layer residuals creating short circuit paths. Solutions to theses problems have been proposed, but routinely involve relatively complex or dimensionally critical fabrication sequences which are costly to produce or degrade the semiconductor chip yield.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,472,906 (Shimizu et al.), U.S. Pat No. 5,399,520 (Jang), U.S. Pat. No. 4,986,879 (Lee) and U.S. Pat. No. 5,248,350 (Lee).

Though a number to the techniques successfully attack and solve the bird's beak problem and usually provide relatively planar final concluding surfaces, the approaches routinely create stress induced dislocations at the edges of the active regions and form topologies which include notches or grooves of sufficient dimension to cause the degradation of subsequently formed gate oxide. The stress induced dislocations are often not even recognized, while the notches or grooves are most often visible in the SEM cross-sections of the final structures.

SUMMARY OF THE INVENTION

It is an object of the present invention to provide a process to form field oxide regions with less stress and less substrate defects.

It is an object of the present invention to provide a process to form field oxide capable of diminishing the factors of generating the bird's beak so as to obtain larger active regions.

It is an object of the present invention to form field oxide regions using a second nitride layer to form a nitride foot at the corner of the field oxide regions.

The invention provides a method of forming field oxide regions between active regions in a semiconductor substrate. The invention forms nitride feet on a nitride oxidation masking block. The nitride feet prevent the formation of bird's peak of the field oxide by blocking the oxygen species from diffusing under the nitride masking block.

The invention begins by forming a first oxide layer over a substrate surface. Next, a first nitride layer is deposited over the first oxide layer. The first nitride layer is patterned to form a masking block over the active regions. A second nitride layer is deposited over the masking block and the substrate surface. The second nitride layer is anisotropically etched forming nitride spacers on the sidewalls of the masking block, and nitride spacer feet on the surface of the first oxide layer. At this point in a first embodiment, the substrate is oxidized, using the masking block, nitride spacers and the nitride spacer feet as an oxidation mask to form field oxide regions.

In a second embodiment, after patterning the first silicon nitride layer to form the masking block, a wet or dry etch is used to remove the exposed first oxide layer. A second oxide layer is re-grown on the substrate surface. The second nitride layer is formed over the masking block and the second oxide layer. The second nitride layer is anisotropically etched forming nitride spacers on the sidewalls of the masking block, and nitride spacer feet on the surface of the second oxide layer.

In a third embodiment, after the spacers and spacer feet are formed but before the field oxide is formed, the substrate is etched using the masking block, nitride spacers and the nitride spacer feet as an etch mask forming trenches in the substrate. The substrate is then oxidized in the trench using the masking block, nitride spacers and the nitride spacer feet as an oxidation mask thereby forming the field oxide regions in the trench. Lastly, the masking block the nitride spacer, and nitride spacer feet are removed. The third embodiment can be used in combination with the first and second embodiments.

The invention provides a less complex and more manufacturable process to form field oxide regions with less stress and less substrate defects and extend LOCOS technologies to the quarter-micron device processes.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DESCRIPTION OF THE PREFERRED EMBODIMENTS

The present invention provides a method of forming field oxide regions between active regions in a semiconductor substrate. A key feature of the invention is the nitride spacer feet 24 which are formed on nitride spacers 20 using an unique modified anisotropic etching process. These spacer feet protect the silicon from lateral oxidation encroachment from the field oxide (e.g., the elimination of the birds beak problem). This reduces stress in the silicon. Also, the process is shorter than conventional processes.

The preferred substrate is composed of a P-type single crystal silicon having a (100) crystallographic orientation. The substrate has active regions where semiconductor devices, such as transistors, will be formed and isolation areas where the field oxide regions will be formed.

Figure 1:
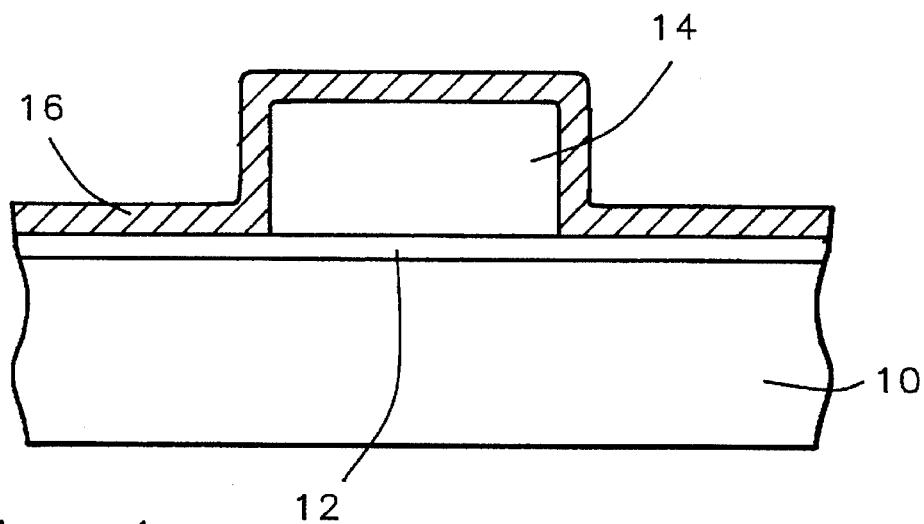
FIGS. 1, 2A, and 2B are cross sectional views in greatly enlarged scale illustrating a first embodiment of the present invention where the nitride spacers and spacer feet are formed.

Referring to FIG. 1, a first insulating layer 12 is formed over a substrate surface 10. The first insulating layer is preferably a first oxide layer 12 formed by oxidizing the substrate surface 10 in a wet, atmospheric pressure environment and at a temperature in a range between about 800° and 1000° C. The first oxide layer 12 preferably has a thickness in a range of between about 100 and 500 Angstroms.

Next, a first nitride layer 14 is deposited over the first insulating (e.g., oxide) layer 12. The first nitride layer can be formed of silicon nitride or a silicon nitride/polysilicon layer. The first nitride layer composed of silicon nitride is preferably formed using a LPCVD process. The LPCVD process is preferably performed by reacting dichlorosilane and ammonia at reduced pressure at a temperature of approximately 700° C. The first nitride layer thickness is preferably in a range between about 1000 and 3000 Angstroms.

Still referring to FIG. 1, the first nitride layer is patterned thereby forming a masking block 14 over the active regions. The first nitride layer can be patterned using conventional photolithography techniques. The masking block 14 has sidewalls. The masking block 14 preferably has a length between 0.35 and 1.0 µm and more preferably larger than about 0.35 µm and, a width between 0.35 µm and 1.0 µm and more preferably larger than about 0.35 µm, and has a thickness in a range between about 1000 and 3000 Angstroms.

Figure 3A:
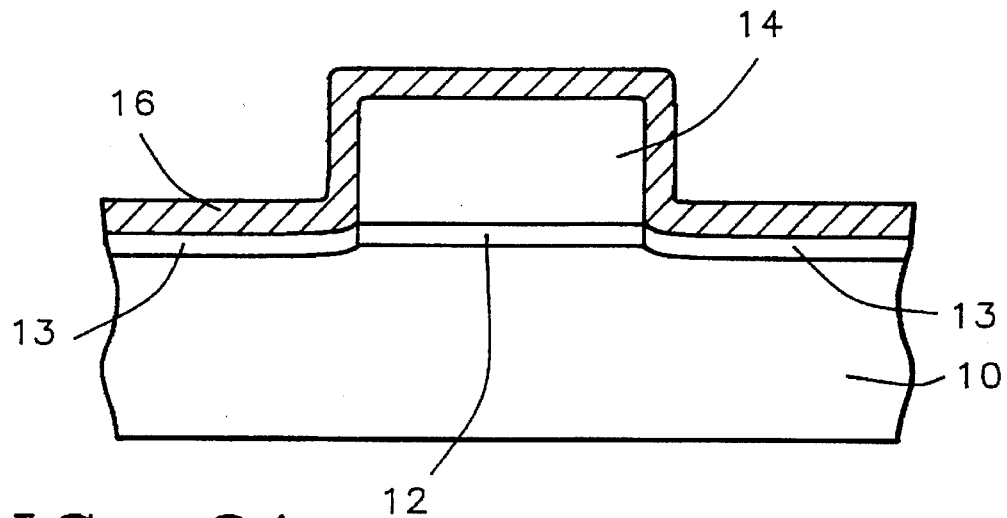
FIGS. 3A, 3B and 3C are cross sectional views of a second embodiment of the present invention where a second insulating layer is grown on the substrate before the nitride spacers and spacer feet 24 are formed.
Figure 3B:
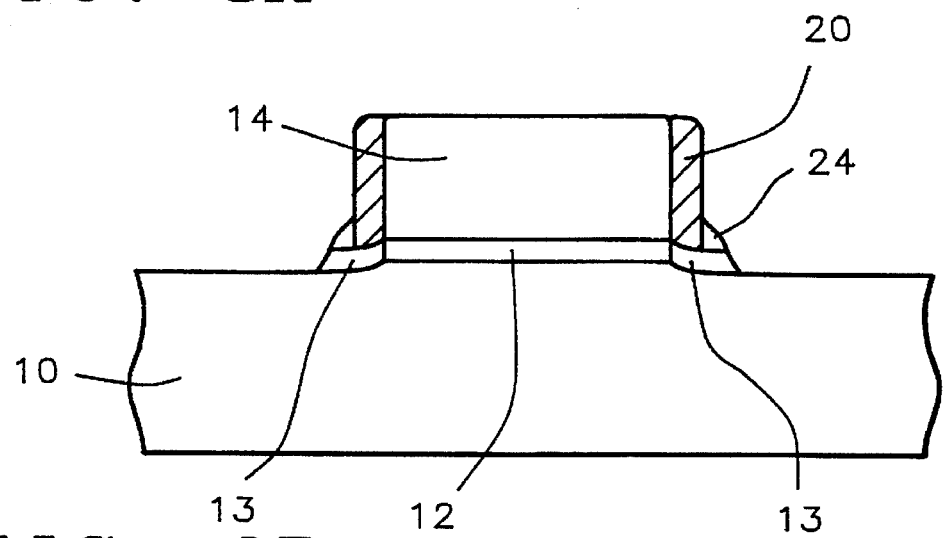

A second embodiment of the present invention can be performed at this point in the process. See FIGS. 3A, 3B and 3C. After the masking block 14 is formed, the first insulating layer 12 can be removed and a second insulating (e.g., oxide) layer 13 can be grown over the substrate as shown in FIG. 3A. This second embodiment is explained in more detail below after the first embodiment is completely described.

As shown in FIG. 1, a second nitride layer 16 is deposited over the masking block 14 and over the substrate surface 10. The second nitride layer can be formed of solely of silicon nitride and a combination of silicon nitride and silicon oxide. The second nitride layer 16 composed silicon nitride is preferably formed using a LPCVD (low pressure chemical vapor deposition) process at a temperature in a range of between about 600° and 800° C. $NH_3$ (ammonia) and $SiH_4$(silane) are preferably used as the reactants. The second nitride layer preferably has a thickness in a range between about 50 and 1000 Angstroms.

Figure 2A:
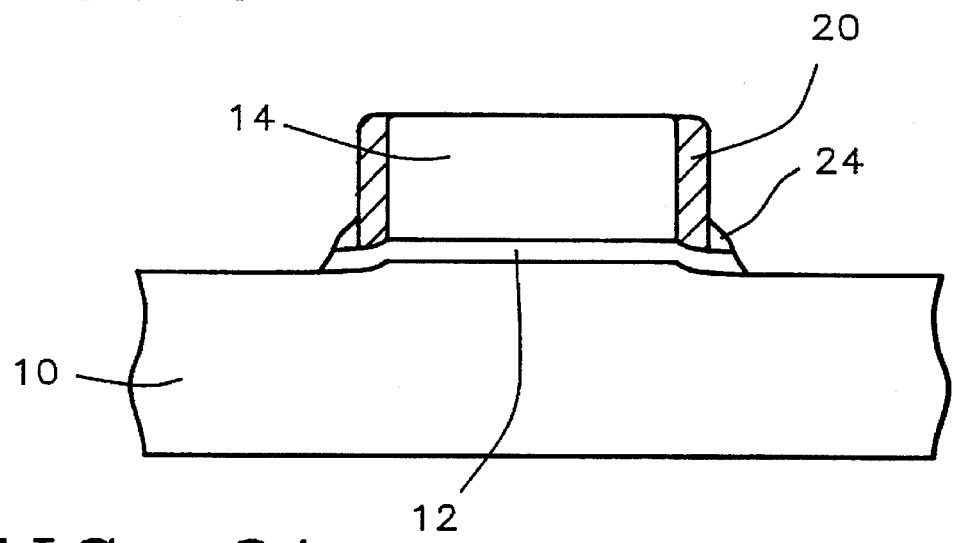
Figure 7:
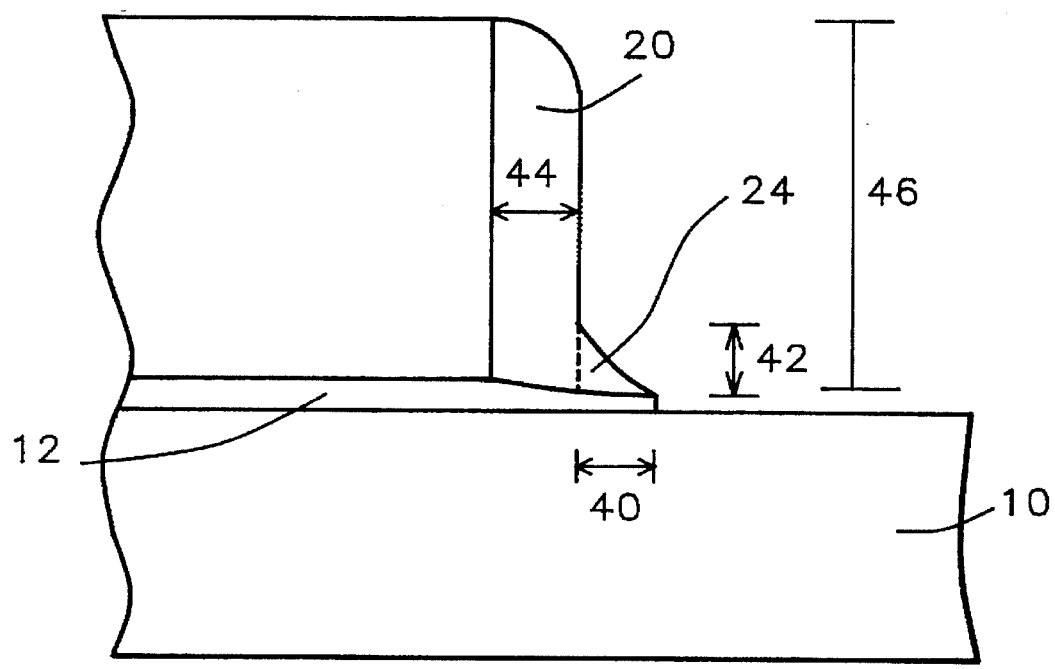
FIG. 7 is a cross sectional view of the nitride spacers and nitride foot of the present invention.

As shown in FIG. 2A, the second nitride layer 16 is etched forming nitride spacers 20 on the sidewalls of the masking block 14, and nitride spacer feet 24 on the surface of the first oxide layer 12. As shown in FIG. 7, the nitride spacers 20 preferably have a width (or thickness) 44 in a range between about 0.005 and 0.1 micrometers, and more preferably 0.04 micrometers. The nitride spacer 20 preferably has a height 46 in a range of between about 1000 and 3000 Å.

The nitride spacer feet 24 preferably have a width (foot length) 40 in a range between about 0.005 and 0.1 micrometers, and more preferably 0.03 micrometers. The nitride spacer feet 24 preferably have a height 42 in a range between about 0.005 and 0.1 micrometers, and more preferably 0.003 micrometers. The dimensions of the nitride feet are critical for the proper functioning of the invention. The width of the spacer feet will affect the effective dimension of active area. The width of the feet is controlled by the customized spacer etch process of the invention. The ratio of spacer feet width to height (or the angle) affects the amount of stress release at the corners of the field oxide and active regions. Therefore the stress relief is controlled by the spacer feet dimensions (e.g., width and height) which is controllable by the custom etch process of the invention.

The customized anisotropic etch of the present invention is critical to properly forming the spacer 20 and spacer feet 24. This etch is modified so that the spacer feet 24 are formed on the side walls of the side wall spacers 20. In conventional etch processes, the etch process is performed to minimize the microloading effect. In the invention, the etch process parameters are modified obtain the proper microloading effects that form the spacer feet 24. The wafer is preferably RIE blanket etched to form the nitride spacers 20 and the nitride spacer feet 24. The etch is controlled so that RIE polymer passivation and microloading effects form the spacer feet 24. Pressure and total gas flow are major factors in the microloading effect. The CF4/CHF3 ratio, electrode temperature and backside Helium (He) flow will affect polymer passivation.

In a critical step, the customized anisotropic etch process of the present invention (both the main etch step and the over etch step) is preferably performed at a temperature in a range between about 0° and −10° C., and more preferably 0° C. Preferably the pressure is in a range between about 200 and 500 mtorr, and more preferably about 360 mtorr, at a power in a range between about 300 and 500 watts, and more preferably about 450 watts, and with a gap spacing in a range between about 0.9 and 1.2 cm, and more preferably about 1.05 cm, with an argon flow rate in a range between about 500 and 1000 sccm, and more preferably 800 sccm, a CF4 (carbon tetrafluoride) flow rate in a range between about 20 and 50 sccm, and more preferably 30 sccm, a flow rate of CHF3 (carbon hydro-trifluoride) between about 20 and 50 sccm, and more preferably 25 sccm. The ratio of $CF_4$ to $CHF_3$ is preferably in a range of about 1:0.6 and 1:2.5 and more preferably in a range of about 1:0.83 to 1:1.17. The etch is preferably performed in planar single wafer RIE. The plasma mode (e.g., etch process) could be RIE, ECR, or high density plasma high density plasma source.

The spacer/feet etch has two steps, a main etch step and an overetch step. Preferably during the main etch, the wafer is etched to an endpoint determined by an end point detector or a timed mode. The main etch step etches the second nitride layer 16 for a main etch time until the masking block is exposed. The wafer is then subjected to an overetch step that is preferably between about 30% to 80% as long as the main overetch step. The overetch step has time more preferably in the range between about 50 and 70 percent of the main etch time most preferably about 60% of the main etch time. This overetch is sometime call a 50 to 70% overetch. The overetch percentage is one of the most important factors to control the feet 24 width 40 and height 42.

At this point the invention can be continued as described in two ways described in the first and third embodiments. In the first embodiment (shown in FIGS. 1, 2A and 2B), the substrate surface is oxidized to form the field oxide regions 26. In third second embodiment, a trench is formed in the substrate and the field oxide is formed in the trench so that the field oxide is level with the substrate surface. (see FIGS. 4, 5 and 6). The third embodiment will be described further below.

Figure 2B:
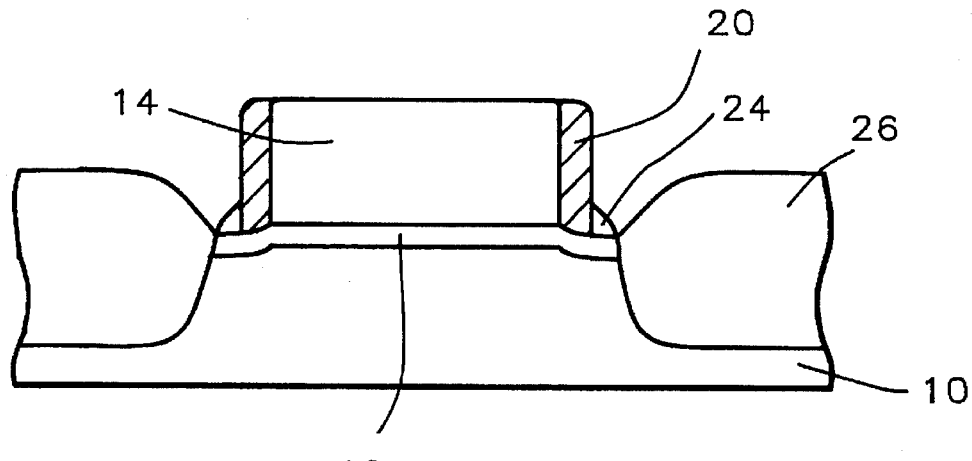

In the first embodiment, as shown in FIG. 2B, the substrate surface 10 is oxidized using the masking block 14, nitride spacers 20 and the nitride spacer feet 24 as an oxidation mask to form field oxide regions 26. The field oxide regions 26 can be formed by oxidizing substrate surface 10, in a wet atmospheric pressure and at a temperature in a range between about 800° and 1100° C.

The field oxide regions are more preferably formed by thermal oxidation at a low pressure in a range of between about 0.1 and 1.0 torr, a temperature in a range of between about 800° and 1100° C. The field oxide regions 26 preferably have a thickness in a range between about 3000 and 7000 Angstroms, and more preferably 4500 Angstroms.

Figure 6:
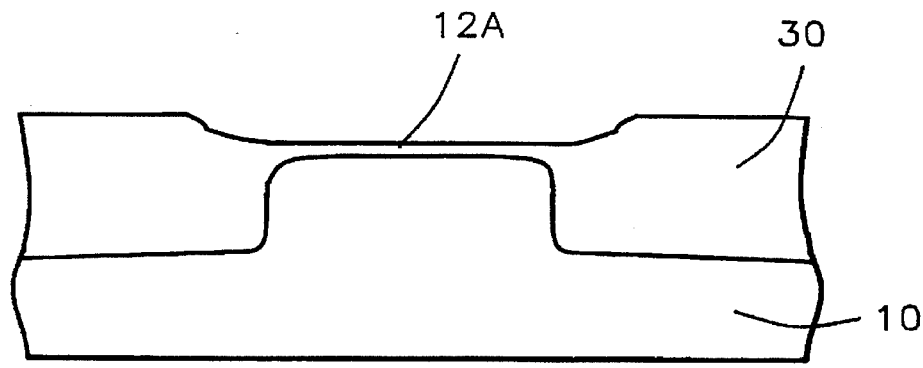

As shown in FIG. 6, the masking block 14, sidewall spacers 20 and nitride spacer feet 24 preferably are removed. Nitride block 14, sidewall spacers 20 and nitride spacer feet 24, are preferably removed with a wet etch selective nitride over silicon oxide, such as hot phosphoric etch. This completes the processing for the first embodiment. The second and third embodiments are describe below.

Figure 3C:
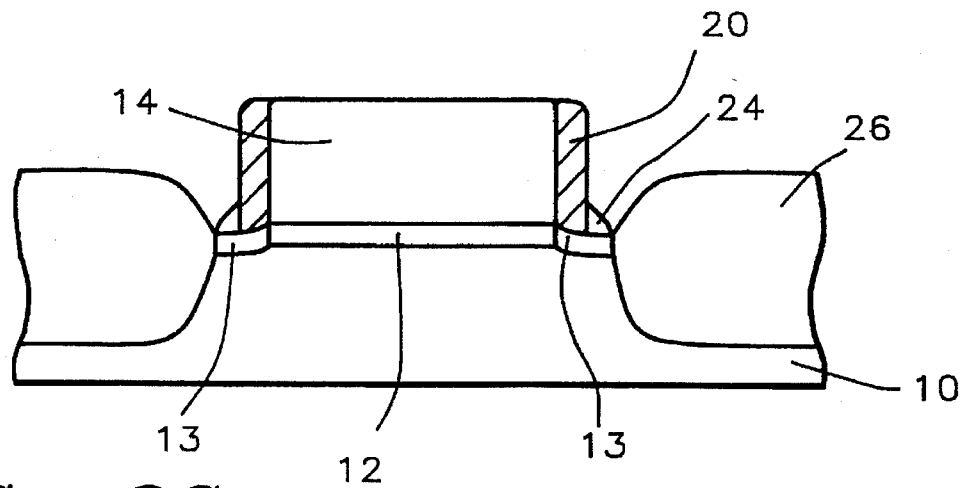

In a second embodiment shown in FIGS. 3A, 3B, 3C and 6, after patterning the first silicon nitride layer to form the masking block 14, a wet or dry etch is used to remove the exposed first oxide layer 12. A second oxide layer 13 is re-grown on the substrate surface 10. See FIG. 3A. The second oxide layer 13 preferably has a thickness in a range of about 45 and 500 Å. The second nitride layer 16 is formed over the masking block and the second oxide layer as shown in FIG. 3C. The spacer 20, spacer feet 24 and field oxide 26 are then formed over the second oxide layer 13 using processes above as in the first embodiment. See FIG. 3C.

The third embodiment of the present invention forms a field oxide region in a trench as shown in FIG. 6. The third embodiment follows the process described above for the first embodiment as shown in FIGS. 1–2B or the 2nd embodiment shown in FIGS. 3A–3C. The process for the third embodiment is shown in FIGS. 1–2, and 4–6. Therefore, in FIGS. 4, 5, 6, and 7, oxide layer 12A can comprise the first oxide layer 12 (1 st embodiment) or both the first oxide layer 12 and the second oxide layer 13.

The third embodiment begins as described above, by forming an oxide layer 12a (12 or 12 and 13), masking block 14, nitride spacers 20, and nitride spacer feet 24 as described above (see FIG. 4).

Figure 4:
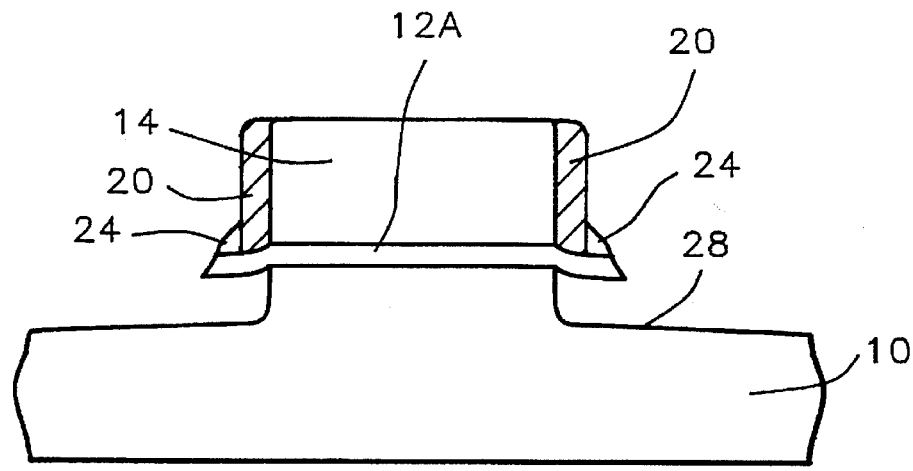
FIGS. 4 through 6 are cross sectional views of a third embodiment of the present invention where field oxide regions are formed in a trench in a substrate using the nitride spacers and spacer feet as oxidation masks.

As shown in FIG. 4, the substrate surface 10 is etched using the masking block 14, nitride spacers 20, and the nitride spacer feet 24 as an etch mask forming trenches 28 in the substrate surface 10. The trenches are formed in the substrate surface 10 using an isotropic wet etch (e.g., a silicon etch which is selective to oxide and nitride), such as HF and HNO3 and DI water or a dry etch, such as a fluorine-gas based downstream plasma etch. Most preferably, the substrate is etched with a downstream plasma etch process using, for example, NF3, $SF_6$ and $CF_4$ gases. The trench 28, preferably has a depth in a range between about 100 and 2000 Angstroms, and more preferably about 1000 Angstroms.

Figure 5:
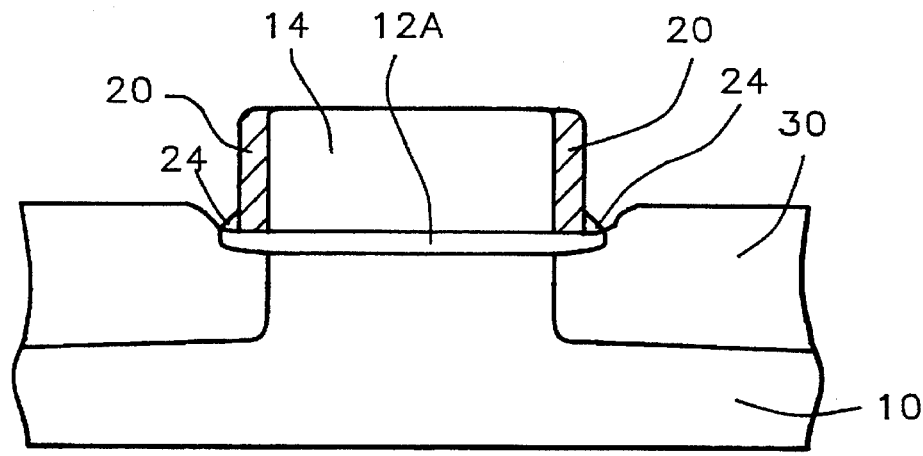

As shown in FIG. 5, the substrate surface 10 is oxidized using the masking block 14, nitride spacers 20 and the nitride spacer feet 24 as an oxidation mask forming the field oxide regions 30. The substrate is preferably thermally oxidized as described above.

As shown in FIG. 6, the masking block 14, and the nitride spacer 20, and the nitride spacer feet 24 are removed (preferably by an etch) leaving the oxide layer 12 or 12A, and field oxide regions 30. The nitride masking block and nitride spacer and feet are preferably removed using a hot phosphoric ($H_3PO_4$) etch.

The present invention forms nitride feet around the edges of a field oxide region. The nitride feet relieve stress and reduce silicon dislocations at the field oxide corners. The nitride feet reduce the oxygen species diffusing and oxidizing silicon at the field oxide corners. This reduces the amount of stress the oxide at the corners and under the pad oxide 12 places on the substrate. Therefore less stress defects are created in the substrate. The nitride feet of the present invention also form improved field oxide regions that do not consume active areas of the substrate. Moreover, the process of forming the nitride feet using the RIE microloading and polymer passivation effects is simple to manufacture and control. The process improves yields by reducing the silicon dislocations and increases device density. The invention's nitride feet 24 can reduce the field oxidation bird's beak encroachment.

While the invention has been particularly shown and described with reference to the preferred embodiments thereof, it will be understood by those skilled in the art that various changes in form and details may be made without departing from the spirit and scope of the invention.

What is claimed is:

1. A method of forming field oxide regions between active regions in a semiconductor substrate, comprising the steps of:

a) forming a first oxide layer over a substrate surface; said substrate having spaced active areas and field oxide areas;

b) depositing a first nitride layer over said first oxide layer;

c) patterning said first nitride layer forming a masking block over said active areas; said masking block having sidewalls;

d) depositing a second nitride layer over said masking block and said first oxide layer;

e) anisotropic etching said second nitride layer and said first oxide layer forming nitride spacers on the said sidewalls of said masking block and forming nitride spacer feet on the sidewalls of said nitride spacers and on the surface of said first oxide layer out from said nitride spacers; and f) oxidizing said substrate using said masking block nitride spacers and said nitride spacer feet as an oxidation mask thereby forming field oxide regions.

2. The method of claim 1 which further includes, after step (e), etching said substrate using said masking block, nitride spacers and said nitride spacer feet as an etch mask forming trenches in said substrate;

and step (f) further includes oxidizing said substrate in said trench, using said masking block, nitride spacers and said nitride spacer feet as an oxidation mask forming said field oxide regions in said trench, and removing said masking block, said nitride spacer, and nitride spacer feet.

3. The method of claim 2 wherein said trenches in said substrate are formed having a depth in a range between about 100 and 2000 Å.

4. The method of claim 1 which further includes: removing said masking block, sidewall spacers and nitride spacer feet.

5. The method of claim 1 wherein said nitride spacers have a width in a range between about 0.005 and 0.1 micrometers and a height in a range of about 1000 and 3000 Å.

6. The method of claim 1 wherein said nitride feet have a width in the range of between about 0.005 and 0.1 μm, and height in the range of between about 0.005 and 0.1 μm.

7. The method of claim 1 wherein the anisotropic etching of said second nitride layer has a main etch step and an overetch step, the main etch step and the over etch step are performed at a temperature in a range between about 0° and −10° C. at pressure in a range between about 200 and 500 mtorr, at a power in a range between about 300 and 500 watts and a gap spacing in a range between about 0.9 and 1.2 cm and with an argon flow in a range between about 500 and 1000 sccm, a $CF_4$ flow rate in a range between about 20 and 50 sccm, a flow rate of CHF3 between about 20 and 50 sccm, and said main etch step etches the second nitride layer for a main etch time until the masking block is exposed, and said overetch step is performed for a time in the range between about 50 and 70 percent of said main etch time.

8. The method of claim 1 wherein said first oxide layer is formed by oxidizing said substrate surface in a wet, atmospheric pressure and in a range between about 800° and 1000° C., and said oxide layer has a thickness in a range of between about 100 and 500 Å.

9. The method of claim 1 wherein said masking block has a length larger than about 0.35 and a width in a range larger than about 0.35 μm and has a thickness in a range between about 1000 and 3000 Å.

10. The method of claim 1 wherein said second nitride layer is deposited over said masking block and said first oxide layer by a LPCVD process at a temperature in a range of between about 600° and 800° C., and using NH3 (ammonia) and SiH4(silane) reactants, and said second nitride layer has a thickness in a range between about 50 and 1000 Å.

11. The method of claim 1 wherein said field oxide regions are formed by oxidizing said substrate surface, in a wet atmospheric pressure and at a temperature in a range between about 800° and 1100° C.; and said field oxide regions having a thickness in a range between about 3000 and 7000 Å.

12. A method of forming field oxide regions between active regions in a semiconductor substrate, comprising the steps of:

a) forming a first oxide layer over a substrate surface; said substrate having spaced active areas and field oxide areas;

b) depositing a first nitride layer over said first oxide layer;

c) patterning said first nitride layer forming a masking block over said active regions; said masking block having sidewalls;

d) depositing a second nitride layer over said masking block and said first oxide layer;

e) anisotropically etching said second nitride layer and said first oxide layer forming nitride spacers on said sidewalls of said masking block and forming nitride spacer feet on the surface of said first oxide layer out from said nitride spacers; said nitride spacer feet having a width in a range of between about 0.005 and 0.1 micrometers; the anisotropic etch using microloading effects to form said nitride spacer feet;

f) etching said substrate using said masking block nitride spacers and said nitride spacer feet as an etch mask forming trenches in said substrate;

g) oxidizing said substrate; using said masking block nitride spacers and said nitride spacer feet as an oxidation mask forming said field oxide regions; and h) removing said masking block said nitride spacer, and nitride spacer feet.

13. The method of claim 12 wherein said trenches in said substrate are formed having a depth in a range between about 0.01 and 0.2 micrometers.

14. The method of claim 12 wherein said nitride spacers have a thickness in a range between about 0.005 and 0.1 micrometers and a height in a range of about 1000 and 3000 Å.

15. The method of claim 12 wherein said nitride feet have a width in the range of between about 0.005 and 0.1 μm, and height in the range of between about 0.005 and 0.1 μm.

16. The method of claim 12 wherein the anisotropic etching of said second nitride layer has a main etch step and an overetch step, the main etch step and the overetch step are performed at a temperature in a range between about 0° and −10° C., at pressure in a range between about 200 and 500 mtorr, at a power in a range between about 300 and 500 watts and a gap spacing in a range between about 0.9 and 1.2 cm and with an argon flow in a range between about 500 and 1000 sccm, a CF4 flow rate in a range between about 20 and 50 sccm, a flow rate of CF3 between about 20 and 50 sccm, and said main etch step etches the second nitride layer for a main etch time until the masking block is exposed, and said overetch step is performed for a time in the range between about 50 and 70 percent of said main etch time.

17. The method of claim 12 wherein said first oxide layer is formed by oxidizing said substrate surface in a wet, atmospheric pressure and at a temperature in a range between about 800° and 1000° C., and said first oxide layer has a thickness in a range of between about 100 and 500 Å.

18. The method of claim 12 wherein said masking block has a length between about 0.35 and 1.0 μm and a width between about 0.35 and 1.0 μm and has a thickness in a range between about 1000 and 3000 Å.

19. The method of claim 12 wherein said second nitride layer is deposited over said masking block and said substance using a LPCVD process at a temperature in a range of between about 600° and 800° C., and using NH3 (ammonia) and SiH4 (silane) reactants, and said second nitride layer has a thickness in a range between about 50 and 1000 Å.

20. The method of claim 12 wherein said field oxide regions are formed by oxidizing substrate surface, in a wet atmospheric pressure and in a range between about 800° and 1100° C.; and field oxide regions having a thickness in a range between about 3000 and 7000 Å.

21. A method of forming field oxide regions between active regions in a semiconductor substrate, comprising the steps of;

a) forming a first oxide layer over a substrate surface; said substrate having spaced active areas and field oxide areas;

b) depositing a first nitride layer over said first oxide layer;

c) patterning said first nitride layer forming a masking block over said active regions; said masking block having sidewalls; the pattern thereby exposing said first oxide layer in said field oxide areas;

d) removing said exposed first oxide layer;

e) growing a second oxide layer over said substrate;

f) depositing a second nitride layer over said masking block and said first oxide layer;

g) etching said second nitride layer forming nitride spacers on the said sidewalls of said masking block and forming nitride spacer feet on the surface of said second oxide layer out from said nitride spacers; said nitride spacer feet having a width in a range of between about 0.005 and 0.1 micrometers; and h) oxidizing said substrate; using said masking block nitride spacers and said nitride spacer feet as an oxidation mask forming said field oxide regions.

22. The method of claim 21 which further includes, after step (g), etching said substrate using said masking block, nitride spacers and said nitride spacer feet as an etch mask forming trenches in said substrate;

and step (h) further includes oxidizing said substrate in said trench, using said masking block, nitride spacers and said nitride spacer feet as an oxidation mask forming said field oxide regions in said trench, and removing said masking block, said nitride spacer, and nitride spacer feet.

23. The method of claim 22 wherein said trenches in said substrate are formed having a depth in a range between about 0.01 and 0.2 micrometers.

24. The method of claim 21 wherein said second oxide layer has a thickness in a range of about 45 and 500 Å.

25. The method of claim 21 which further includes: removing said masking block, sidewall spacers and nitride spacer feet.

26. The method of claim 21 wherein said nitride spacers have a thickness in a range between about 0.005 and 0.1 micrometers.

27. The method of claim 21 wherein said nitride feet have a width in the range of between about 0.005 and 0.1 µm, and height in the range of between about 0.005 and 0.1 µm.

28. The method of claim 21 wherein the anisotropic etching of said second nitride layer has a main etch step and an overetch step, the main etch step and the overetch step are performed at a temperature in a range between about 0° and −10° C., at pressure in a range between about 200 and 500 mtorr, at a power in a range between about 300 and 500 watts and a gap spacing in a range between about 0.9 and 1.2 cm and with an argon flow in a range between about 500 and 1000 sccm, a CF4 flow rate in a range between about 20 and 50 sccm, a flow rate of CHF3 between about 20 and 50 sccm, and said main etch step etches the second nitride layer for a main etch time until the masking block is exposed, and said overetch step is performed for a time in the range between about 50 and 70 percent of said main etch time.

29. The method of claim 21 wherein said first oxide layer is formed by oxidizing said substrate surface in a wet, atmospheric pressure and in a range between about 800° and 1000° C., and said oxide layer has a thickness in a range of between about 100 and 500 Å.

30. The method of claim 21 wherein said masking block has a length larger than 0.35 µm and a width in a range larger than about 0.35 µm and has a thickness in a range between about 1000 and 3000 Å.

31. The method of claim 21 wherein said second nitride layer is deposited over said masking block and said substance by a LPCVD process at temperature in a range of between about 600° and 800° C., and using NH3 (ammonia) and SiH4 (silane), and has a thickness in a range between about 50 and 1000 Å.

32. The method of claim 21 wherein said field oxide regions are formed by oxidizing substrate surface, in a wet atmospheric pressure and in a range between about 800° and 1100° C.; and field oxide regions have a thickness in a range between about 3000 and 7000 Å.

33. A method of forming field oxide regions between active regions in a semiconductor substrate, comprising the steps of:

a) forming a first oxide layer over a substrate surface; said substrate having spaced active areas and field oxide areas;

b) depositing a first nitride layer over said first oxide layer;

c) patterning said first nitride layer forming a masking block, over said active regions; said masking block having sidewalls;

d) depositing a second nitride layer over said masking block and said substrate surface;

e) anisotropically etching said second nitride layer and said first oxide layer forming nitride spacers on said sidewalls of said masking block and nitride spacer feet on the surface of said first oxide layer; the anisotropic etching of said second nitride layer has a main etch step and an overetch step, the main etch step and the overetch step are performed at a temperature in a range between about 0° and −10° C., at a pressure in a range between about 200 and 500 mtorr, at a power in a range between about 300 and 500 watts and a gap spacing in a range between about 0.9 and 1.2 cm and an argon flow in a range between about 500 and 1000, a CF4 flow rate in a range between about 20 and 50, a flow rate of CHF3 between about 20 and 50 sccm and said overetch step is performed for a time in the range between about 50 and 70 percent of said main etch time;

f) etching said substrate using said masking block, nitride spacers and said nitride spacer feet as an etch mask forming trenches in said substrate;

g) oxidizing said substrate in said trenches using said masking block, nitride spacers and said nitride spacer feet as an oxidation mask forming said field oxide regions; and h) removing said masking block, said nitride spacer, and nitride spacer feet.

34. A method of forming field oxide regions between active regions in a semiconductor substrate, comprising the steps of:

a) forming a first oxide layer over a substrate surface; said substrate having spaced active areas and field oxide areas;

b) depositing a first nitride layer over said first oxide layer;

c) patterning said first nitride layer forming a masking block, over said active regions; said masking block having sidewalls; the patterning thereby exposing said first oxide layer in said field oxide areas;

d) removing said exposed first oxide layer;

e) growing a second oxide layer over said substrate;

f) depositing a second nitride layer over said masking block, 14 and said substrate surface;

g) etching said second nitride layer forming nitride spacers on the said sidewalls of said masking block, and nitride spacer feet on the surface of said first oxide layer; the anisotropic etching of said second nitride layer has a main etch step and an overetch step, the main etch step and the overetch step are performed at a temperature in a range between about 0° and −10° C., at a pressure in a range between about 200 and 500 mtorr, at a power in a range between about 300 and 500 watts and a gap spacing in a range between about 0.9 and 1.2 cm and an argon flow in a range between about 500 and 1000 sccm, a CF4 flow rate in a range between about 20 and 50 sccm, a flow rate of CHF3 between about 20 and 50 sccm and said overetch step is performed for a time in the range between about 50 and 70 percent of said main etch time; and h) oxidizing said substrate using said masking block, nitride spacers and said nitride spacer feet as an oxidation mask forming said field oxide regions.

* * * * *